US007782132B2

(12) United States Patent
Plotnik et al.

(10) Patent No.: US 7,782,132 B2
(45) Date of Patent: Aug. 24, 2010

(54) METHOD AND APPARATUS FOR IMPROVING THE PERFORMANCE OF MIMO WIRELESS SYSTEMS

(75) Inventors: Eli Plotnik, Kfar Saba (IL); Avner Elia, Ramat Ishai (IL)

(73) Assignee: Paragon Communications Ltd., Haifa (IL)

( * ) Notice: Subject to any disclaimer, the term of this patent is extended or adjusted under 35 U.S.C. 154(b) by 155 days.

(21) Appl. No.: 12/067,915

(22) PCT Filed: Sep. 26, 2006

(86) PCT No.: PCT/IL2006/001130
§ 371 (c)(1),
(2), (4) Date: Apr. 1, 2008

(87) PCT Pub. No.: WO2007/034500
PCT Pub. Date: Mar. 29, 2007

(65) Prior Publication Data
US 2009/0140804 A1    Jun. 4, 2009

(51) Int. Cl.
*H03F 3/68* (2006.01)
(52) U.S. Cl. .................................. 330/124 R; 330/295
(58) Field of Classification Search ............. 330/124 R, 330/297, 295, 84, 126
See application file for complete search history.

(56) References Cited
U.S. PATENT DOCUMENTS 5,942,938 A * 8/1999 Myers et al. ................. 330/10
6,137,355 A * 10/2000 Sevic et al. .................. 330/51
6,255,906 B1 * 7/2001 Eidson et al. ........... 330/124 R
6,437,641 B1   8/2002 Bar-David
6,831,519 B2  12/2004 Bar-David et al.
6,998,914 B2 * 2/2006 Robinson ................. 330/124 R
2004/0018821 A1  1/2004 Bar-David et al.

FOREIGN PATENT DOCUMENTS

EP           1492228 A1   12/2004
WO        WO0167593 A2    9/2001
WO       WO03103134 A1   12/2003

* cited by examiner

*Primary Examiner*—Henry K Choe
(74) *Attorney, Agent, or Firm*—Marsteller & Associates, P.C.

(57) ABSTRACT

Method and apparatus for efficiently providing DC power enhancement to power amplifiers each of which being arranged in a MIMO system, by suing an enhancement circuitry with a plurality of inputs and outputs. Each input has a corresponding DC enhancement output that is connected to a DC enhancement input of a power amplifier. The DC enhancement output becomes operative whenever the amplitude of the corresponding input signal exceeds a predetermined threshold. The envelope of a plurality of input signals is sampled by sampling circuitries and the sampled envelopes are fed into a summation circuitry, in which they are summed. Whenever one of the sampled envelopes exceeds the threshold, a DC enhancement power is simultaneously provided to all DC enhancement inputs of all power amplifiers.

6 Claims, 2 Drawing Sheets

METHOD AND APPARATUS FOR IMPROVING THE PERFORMANCE OF MIMO WIRELESS SYSTEMS

FIELD OF THE INVENTION

The present invention relates to the field of RF Power Amplifiers (PAs). More particularly, the invention relates to a method and apparatus for improving the performance of Multiple Input—Multiple Output (MIMO) wireless systems.

BACKGROUND OF THE INVENTION

The technique of eXcess eNvelope eNhancement (XNN®) for power amplifiers (PA) is a simplification of Envelope Tracking (ET), which is a solution for efficiency enhancement and power boost of power amplifiers, particularly for the low power WiFi and high power and low power WiMAX market applications, as well as for existing high power cellular applications and forthcoming cellular standards. Such solution is disclosed, for example in U.S. Pat. No. 6,831,519, in U.S. Pat. No. 6,437,641 and in US Patent Application No. 2004/0018821.

The Voltage Enhancement Circuit (VEC™) modulates the supply voltage of power amplifiers as part of the XNN® technology, disclosed in U.S. Pat. No. 6,437,641. Appropriate modulation of the supply voltage prevents saturation of power amplifiers while amplifying signals that exceed a pre-defined programmable threshold.

A MIMO system requires using of several power amplifiers, one for each transmitting path of the information signal. Conventional implementation of XNN® technology for this case requires using a VEC™ circuit for each replica of the signal. However, using several VEC™ circuits on one board might be expensive and area as well as power consuming. Therefore, a novel technique for reducing the number of VEC™ circuits required for the operation of a MIMO system is needed.

All the methods described above have not yet provided satisfactory solutions to the problem of efficiently providing power enhancement to several power amplifiers, arranged in a MIMO system.

It is therefore an object of the present invention to provide a method and circuitry for efficiently providing power enhancement to several power amplifiers, arranged in a MIMO system.

It is another object of the present invention to provide a method and circuitry for efficiently providing power enhancement to power amplifiers, arranged in a MIMO system.

It is another object of the present invention to provide a method and circuitry for efficiently providing power enhancement to power amplifiers, arranged in a MIMO system, while reducing heat dissipation.

It is a further object of the present invention to provide a method and circuitry for efficiently providing power enhancement to power amplifiers, arranged in a MIMO system, while reducing the output signal distortion.

It is yet an object of the present invention to provide a method and circuitry for efficiently providing power enhancement to power amplifiers, arranged in a MIMO system, while reducing the area, costs and power dissipation of the enhancement circuitry.

Other objects and advantages of the invention will become apparent as the description proceeds.

SUMMARY OF THE INVENTION

The present invention is directed to a method for efficiently providing DC power enhancement to power amplifiers each of which being arranged in a MIMO system. An enhancement circuitry with a plurality of inputs and outputs is provided, such that each input has a corresponding DC enhancement output that is connected to a DC enhancement input of a power amplifier. The DC enhancement output is operative whenever the amplitude of the corresponding input signal exceeds a predetermined threshold. The envelope of a plurality of input signals is sampled by sampling circuitries and the sampled envelopes are fed into a summation circuitry, in which they are summed. Whenever one of the sampled envelopes exceeds the threshold, a DC enhancement power is simultaneously provided to all DC enhancement inputs of all power amplifiers.

Preferably, the summation circuitry may include an open collector configuration.

The input and the output of the amplifiers may be matched whenever required, in order to keep the amplifiers to be unconditionally stable under any level of input signal.

The present invention is also directed to an apparatus for efficiently providing DC power enhancement to power amplifiers each of which being arranged in a MIMO system, that comprises:

an enhancement circuitry with a plurality of inputs and outputs, such that each input has a corresponding DC enhancement output, connected to a DC enhancement input of a power amplifier and becomes operative whenever the amplitude of the corresponding input signal exceeds a predetermined threshold;

sampling circuitry for sampling the envelope of a plurality of input signals by sampling circuitries; and a summation circuitry into which the sampled envelopes are fed, for summing the sampled envelopes.

The enhancement circuitry simultaneously provides a DC enhancement power to all DC enhancement inputs of all power amplifiers, whenever one of the sampled envelopes exceeds the threshold.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The proposed invention utilizes a modification of a single Voltage Enhancement Circuit (VEC™) as disclosed in U.S. Pat. No. 6,831,519 to simultaneously support the operation of several Power Amplifiers in MIMO wireless systems. The novel circuit MIMO SVEC (MIMO Single Voltage Enhancement Circuit) contributes to power output improvement, efficiency improvement, heat dissipation reduction, and out of band spectral purity of the various PAs employed in MIMO wireless systems. Each of the transceivers in the system may support multiple frequency bands.

Figure 1:
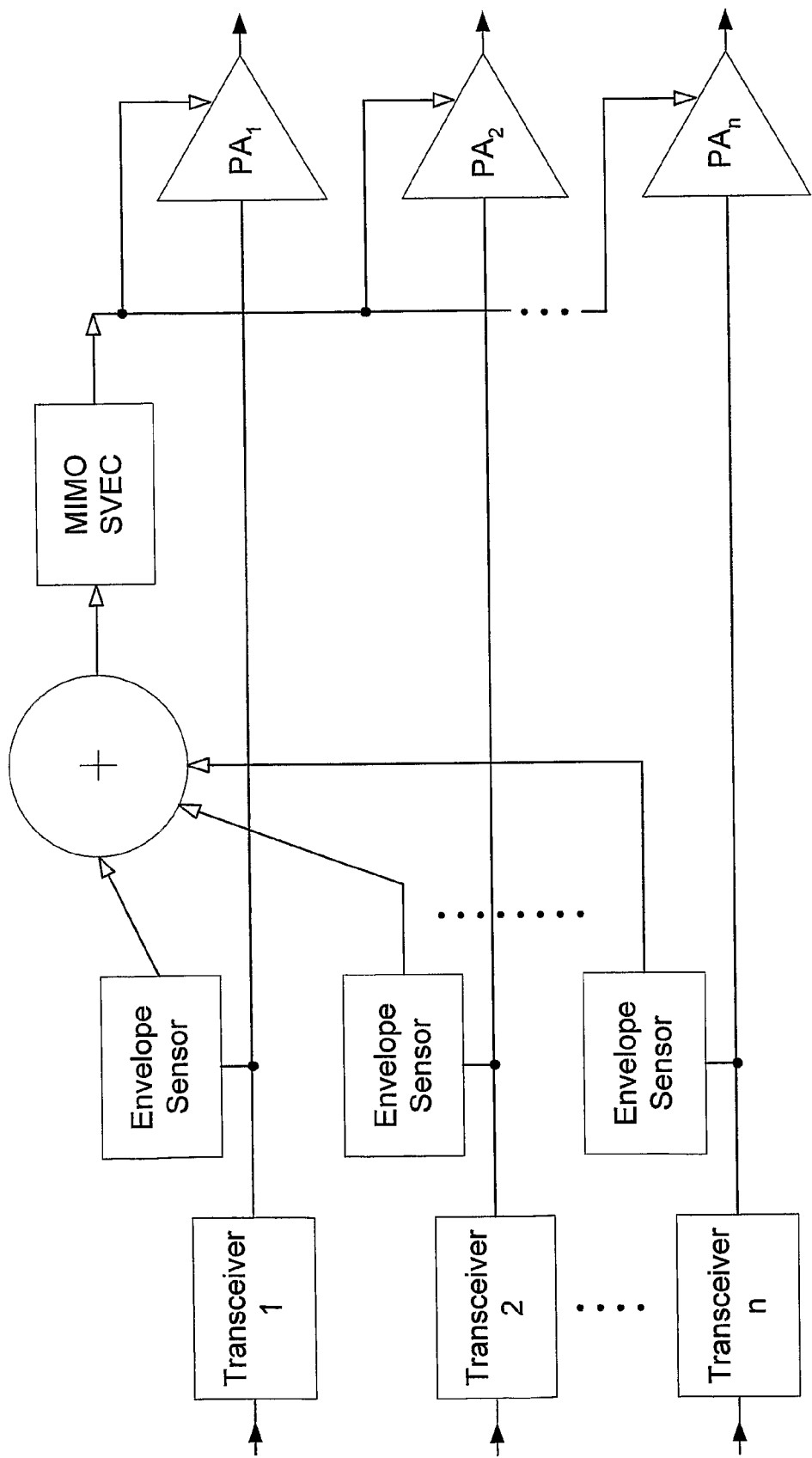
FIG. 1 illustrates the architecture of a MIMO wireless communication system containing a MIMO SVEC (Single VEC)

FIG. 1 shows the architecture of a MIMO wireless communication system containing a MIMO SVEC. The System includes N transceivers that transmit simultaneously N different information signals. Each information signal is used as an input to an envelope sensor whose output is the envelope of that information signal.

Reducing the number of VEC™ circuits needed for the proper operation of the MIMO system is done by summing the N envelopes using open collector configuration, as disclosed for example, in US Patent Application No. 2004/0018821. The suggested configuration avoids switching, and boosts all PAs simultaneously, each time a peak in the amplitude of an input signal occurs. Whenever a peak Pn (n=1, ..., N) occurred, very small degradation in the performance of the remaining N−1 PAs has been observed (using simulations and preliminary testing done with IEEE 802.11g signals, according to the Wi-Fi standard) due to over enhancement (i.e., enhancement even when no peak occurs) in these remaining N−1 PAs.

Figure 2:
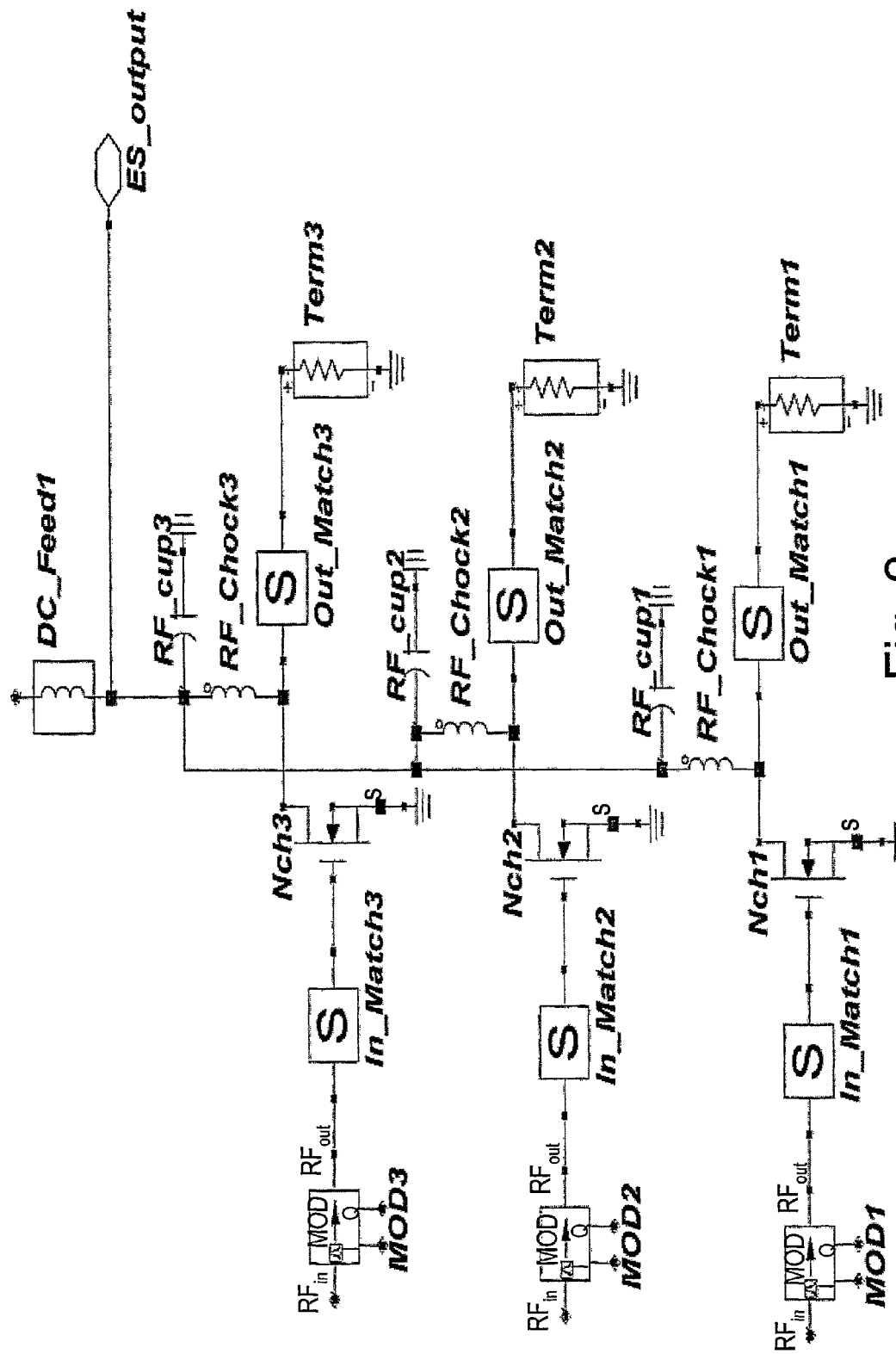
FIG. 2 illustrates an RF Envelope Sensor for detecting the envelope signal is illustrated, according to a preferred embodiment of the invention.

An RF Envelope Sensor implementation of MIMO SVEC for detecting the envelope signal is illustrated in FIG. 2. The detection method proposed by the present invention may be applied for detecting video envelope of signals from independent sources in several frequency bands within a single circuit. This may be done by connecting together video envelope outputs of several RF transistors. For each signal, each of the transistors operates independently of the other transistors. This connection, usually termed "open collector" connection, allows using a single VEC™ for multi source applications, such as MIMO systems.

Since enhancement is generally implemented under large signal conditions, in a preferred embodiment, whenever required, the input and the output of the amplifiers may include matching circuits, in order to keep the amplifiers to be unconditionally stable under any level of input signal.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method for efficiently providing DC power enhancement to power amplifiers each of which being arranged in a MIMO system, comprising:
   a) providing an enhancement circuitry having a plurality of inputs and outputs, such that each input has a corresponding DC enhancement output, connected to a DC enhancement input of a power amplifier and being operative whenever the amplitude of the corresponding input signal exceeds a predetermined threshold;
   b) sampling the envelope of a plurality of input signals by sampling circuitries;
   c) feeding the sampled envelopes into a summation circuitry and summing said sampled envelopes; and
   d) whenever one of said sampled envelopes exceeds said threshold, simultaneously providing a DC enhancement power to all DC enhancement inputs of all power amplifiers.

2. A method according to claim 1, wherein the summation circuitry includes an open collector configuration.

3. A method according to claim 1, further comprising matching the input and the output of two or more amplifiers, thereby causing said amplifiers to be unconditionally stable under any level of input signal.

4. Apparatus for efficiently providing DC power enhancement to power amplifiers each of which being arranged in a MIMO system, comprising:
   e) an enhancement circuitry having a plurality of inputs and outputs, such that each input has a corresponding DC enhancement output, connected to a DC enhancement input of a power amplifier and being operative whenever the amplitude of the corresponding input signal exceeds a predetermined threshold;
   f) sampling circuitry for sampling the envelope of a plurality of input signals by sampling circuitries; and
   g) a summation circuitry into which the sampled envelopes are fed, for summing said sampled envelopes,
wherein said enhancement circuitry simultaneously provides a DC enhancement power to all DC enhancement inputs of all power amplifiers, whenever one of said sampled envelopes exceeds said threshold.

5. Apparatus according to claim 3, in which the summation circuitry includes an open collector configuration.

6. Apparatus according to claim 3, further comprising matching circuitry for matching the input and the output of two or more amplifiers to be unconditionally stable under any level of input signal.

\* \* \* \* \*